(12) United States Patent
Zhou

(10) Patent No.: US 11,616,499 B2
(45) Date of Patent: Mar. 28, 2023

(54) BI-DIRECTIONAL BUFFER HAVING A LOW BIAS VOLTAGE AND A FAST TRANSIENT RESPONSE

(71) Applicant: Chengdu Monolithic Power Systems Co., Ltd., Chengdu (CN)

(72) Inventor: Yong Zhou, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 17/700,801

(22) Filed: Mar. 22, 2022

(65) Prior Publication Data

US 2022/0329238 A1 Oct. 13, 2022

(30) Foreign Application Priority Data

Apr. 9, 2021 (CN) .......................... 202110385965.7

(51) Int. Cl.
*H03K 5/01* (2006.01)
*H03K 5/24* (2006.01)
(Continued)

(52) U.S. Cl.
CPC ................. *H03K 5/01* (2013.01); *H03K 5/24* (2013.01); *H03K 17/56* (2013.01); *H03F 3/45475* (2013.01)

(58) Field of Classification Search
CPC ............ H03K 5/01; H03K 5/24; H03K 17/56; H03K 19/003; H03K 19/018521; H03K 19/017509; H03K 19/0005; H03K 19/00315; H03K 5/08; H03K 5/023; H03K 19/20; H03K 19/0185; H03K 17/687; H03K 19/0175; H03K 17/063; H03K 17/284; H03K 17/6872; H03K 19/0016; H03K 19/017545; H03K 19/0948; H03K 2217/0063; H03K 2217/0072; H03K 3/037; H03K 3/356017; H03K 5/125; H03K 19/00384; H03K 19/01759; H03K 19/018507; H03K 19/1732; H03K 3/012; H03K 3/356113; H03K 19/0008; H03K 19/0013; H03K 19/0136; H03K 3/356182; H03F 3/45475; H03F 3/211; H03F 3/72; H03F 2203/45436; H03F 2203/7206; H03F 2203/21154; H03F 1/56; H03F 1/02; H03F 2203/45434; H03F 2203/45088; H03F 2203/30027; H03F 2203/30042; H03F 2203/45684; H03F 2203/21131;
(Continued)

(56) References Cited

U.S. PATENT DOCUMENTS

2009/0153193 A1* 6/2009 Aranovsky .... H03K 19/018521
326/90
2021/0184454 A1* 6/2021 Addington .............. G06F 13/00

* cited by examiner

*Primary Examiner* — John W Poos
*Assistant Examiner* — Tyler J Pereny
(74) *Attorney, Agent, or Firm* — Perkins Coie LLP

(57) ABSTRACT

A bi-directional buffer for applications using in an I2C or SMBUS or other bus systems. The bi-directional buffer has an input terminal to receive an input voltage signal and an output terminal for providing an output voltage signal, and the output voltage signal follows the input voltage signal. The output voltage signal is regulated to have a first bias voltage greater than the input voltage signal by a first operational amplifier, or to have a second bias voltage greater than the input voltage signal by a second operational amplifier, the second bias voltage is smaller than the first bias voltage.

11 Claims, 4 Drawing Sheets

(51) Int. Cl.
*H03K 17/56* (2006.01)
*H03F 3/45* (2006.01)

(58) Field of Classification Search
CPC ............. H03F 1/30; H03F 2203/45426; H03F 2200/24; H03F 2200/15; H03F 2203/45402; G11C 7/1084; G11C 7/1057; H02M 3/158; H04L 25/028; H04L 25/0292; H04L 12/40013; H04L 25/0272; H04L 12/40; H04L 2012/40215; H04L 25/0286; H04L 5/16; H04L 25/02; H04L 25/029; H04B 1/16; H04B 1/40
See application file for complete search history.

BI-DIRECTIONAL BUFFER HAVING A LOW BIAS VOLTAGE AND A FAST TRANSIENT RESPONSE

CROSS-REFERENCE TO RELATED APPLICATIONS

This application claims the benefit of Chinese Patent Application No. 202110385965.7, filed on Apr. 9, 2021, which is incorporated herein by reference in its entirety.

TECHNICAL FIELD

This disclosure generally relates to a buffer, and more particularly but not exclusively relates to a bi-directional buffer.

BACKGROUND

A bi-directional buffer is widely used in an I2C, PMBUS or other bus systems for transmitting clock signals or digital signals, these I2C, PMBUS or other bus systems have protocol standards defined for signal transmission. When a bi-directional buffer transits an input voltage signal to an output voltage signal, it is desired to have no oscillation during a transition. Usually the bi-directional buffer is designed to have a big bias voltage between the output voltage signal and the input voltage signal to avoid an oscillation, thus the bi-directional buffer may not satisfy the protocol standards of some bus systems.

Therefore, it is desired to design a bi-directional buffer having a fast transient response and having a relative small bias voltage between the output voltage signal and the input voltage signal.

SUMMARY

In accomplishing the above and other objects, the present invention provides a bi-directional buffer having an input terminal to receive an input voltage signal, and an output terminal to output an output voltage signal, wherein the output voltage signal follows the input voltage signal. The bi-directional buffer comprises a first driving switch, a second driving switch, a first switch, a first comparator, a first operational amplifier and a second operational amplifier. The first driving switch has a first terminal, a second terminal, and a driving terminal, wherein the first terminal of the first driving switch is coupled to the output terminal. The second driving switch has a first terminal, a second terminal and a driving terminal, wherein the first terminal of the second driving switch is coupled to the output terminal. The first switch has a first terminal and a second terminal, wherein the first terminal of the first switch is coupled to the second terminal of the first driving switch and the second terminal of the second driving switch, the second terminal of the first switch is coupled to a reference ground. The first comparator is configured to generate a first comparison signal by comparing the input voltage signal with a first voltage threshold and a second voltage threshold to control the first switch, wherein when the input voltage signal is increased to the first voltage threshold, the first switch is turned off, and when the input voltage signal is decreased to the second voltage threshold, the first switch is turned on. The first operational amplifier is configured to receive the input voltage signal and the output voltage signal, and to generate a first gate signal to the first driving switch to regulate a voltage difference between the output voltage signal and the input voltage signal at a first bias voltage. The second operational amplifier is configured to receive the input voltage signal and the output voltage signal, and to generate a second gate signal to the second driving switch to regulate the voltage difference between the output voltage signal and the input voltage signal at a second bias voltage, wherein the second bias voltage is smaller than the first bias voltage.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

DETAILED DESCRIPTION

Various embodiments of the present invention will now be described. In the following description, some specific details, such as example circuits and example values for these circuit components, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in an embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
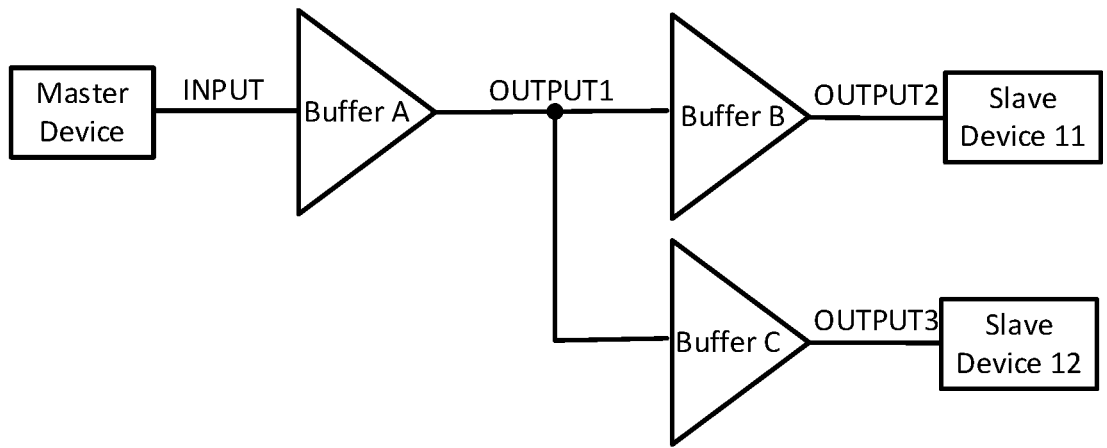
FIG. 1 illustrates a block diagram of a prior art transmission system with three bi-directional buffers.

FIG. 1 illustrates a block diagram of a prior art transmission system with three bi-directional buffers. The input voltage signal INPUT is transmitted from a master device to a slave device 11 by two series connected bi-directional buffer A and bi-directional buffer B, and the input voltage signal INPUT is transmitted from the master device to a slave device 12 by series connected bi-directional buffer A and bi-directional buffer C. That is, a transmission system may transit an input voltage signal from a master device to a plurality of slave devices by a flexible configuration of a plurality of bi-directional buffers in series or in parallel. In FIG. 1, the input voltage signal INPUT is transmitted from the master device to the bi-directional buffer B by the bi-directional buffer A and a first output voltage signal OUTPUT1 is generated based on the input voltage signal INPUT, the first output voltage signal OUTPUT1 is transmitted from the bi-directional buffer B to the slave device 11 by the bi-directional buffer B, and a second output voltage signal OUTPUT2 is generated based on the first output voltage signal OUTPUT1.

Figure 2:
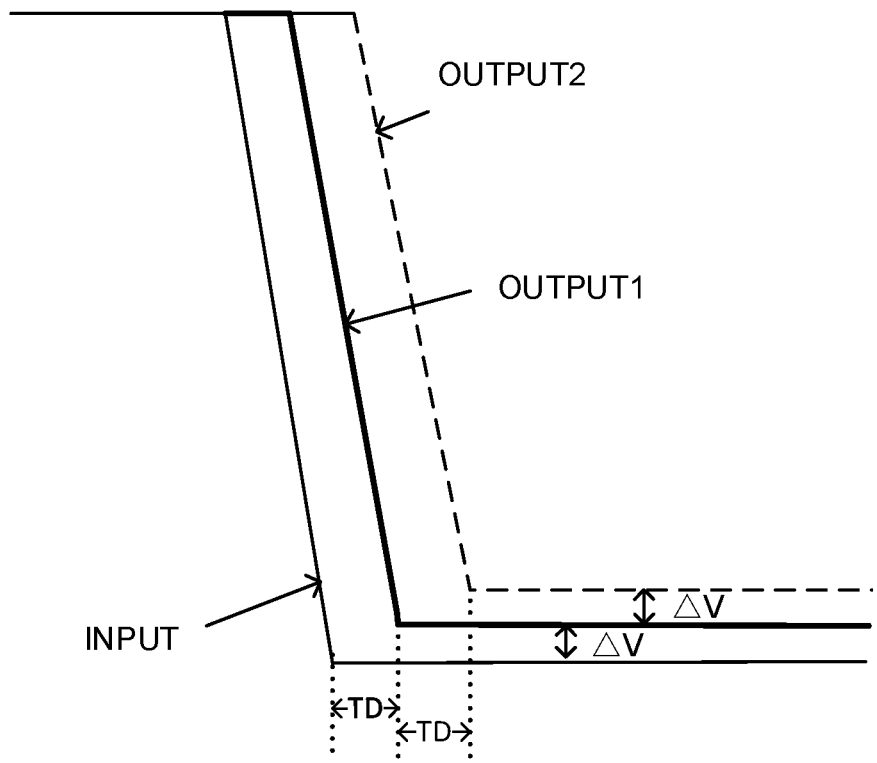
FIG. 2 illustrates a waveform diagram of the first output voltage signal OUTPUT1 and the second output voltage signal OUTPUT2 that theoretically generated by the prior art transmission system in FIG. 1.

FIG. 2 illustrates a waveform diagram of the first output voltage signal OUTPUT1 and the second output voltage signal OUTPUT2 that theoretically generated by the prior art transmission system in FIG. 1. In FIG. 2, the first output voltage signal OUTPUT1 and the input voltage signal INPUT have a delay duration TD due to a unavoidable transmission delay, and the first output voltage signal OUTPUT1 at a logic low state is greater than the input voltage signal INPUT at a logic low state by a bias voltage ΔV to prevent the bi-directional buffer from locking up. Based on the same operating principle of the bi-directional buffer A, the second output voltage signal OUTPUT2 and the first output voltage signal OUTPUT1 also have the delay duration TD, and the second output voltage signal OUTPUT2 at a logic low state is also greater than the first output voltage signal OUTPUT1 at the logic low state by the bias voltage ΔN. The bias voltage ΔV and the delay duration TD are two key electrical parameters for each bi-directional buffer, wherein number of bi-directional buffers that can be allowed connected in series in a transmission system is mainly determined by the bias voltage ΔV and the delay duration TD.

Figure 3:
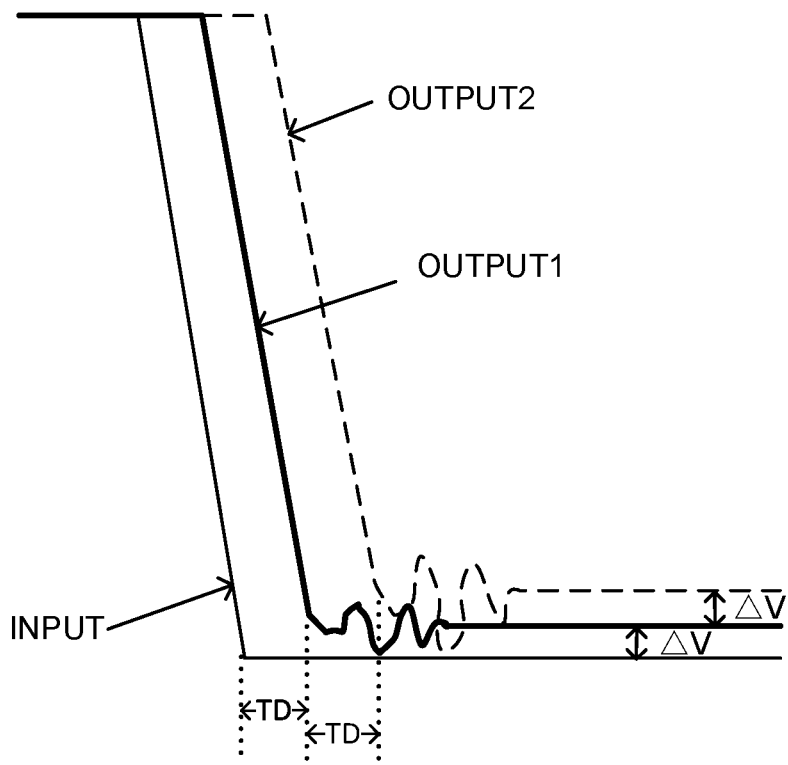
FIG. 3 illustrates a waveform diagram of the first output voltage signal OUTPUT1 and the second output voltage signal OUTPUT2 when the input voltage signal INPUT transits from the logic high state to the logic low state in the prior art transmission system shown in FIG. 1.

FIG. 3 illustrates a waveform diagram of the first output voltage signal OUTPUT1 and the second output voltage signal OUTPUT2 when the input voltage signal INPUT transits from the logic high state to the logic low state in the prior art transmission system shown in FIG. 1. For a prior art bi-directional buffer, if the delay duration TD between the first output voltage signal OUTPUT1 and the input voltage signal INPUT is very small, and the bias voltage ΔV between the first output voltage signal OUTPUT1 at the logic low state and the input voltage signal INPUT at the logic low state is also relative small, the first output voltage signal OUTPUT1 is easy to have a oscillation when it translates from a logic high state to a logic low state. The oscillation of the first output voltage signal OUTPUT1 is further amplified when the second output voltage signal OUTPUT2 is generated based on the first output voltage signal OUTPUT2, which it is easy to cause a false trigger. Therefore, it is desired to design a bi-directional buffer to have short delay duration TD, small bias voltage ☐V with small oscillation.

Figure 4:
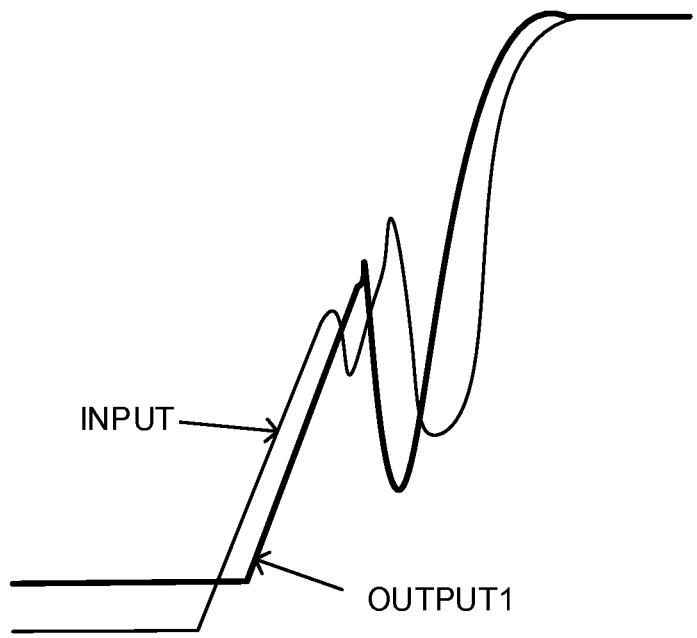
FIG. 4 illustrates a waveform diagram of the output voltage signal OUTPUT when the input voltage signal INPUT transits from the logic low state to the logic high state in the prior art transmission system shown in FIG. 1.

FIG. 4 illustrates a waveform diagram of the first output voltage signal OUTPUT when the input voltage signal INPUT transits from the logic low state to the logic high state in the prior art transmission system shown in FIG. 1. For a prior art bi-directional buffer, when the input voltage signal INPUT rises, the first output voltage signal OUTPUT1 may be pulled down by the input voltage signal INPUT again, thus it is easy for the prior art bi-directional buffer to have a false trigger.

Figure 5:
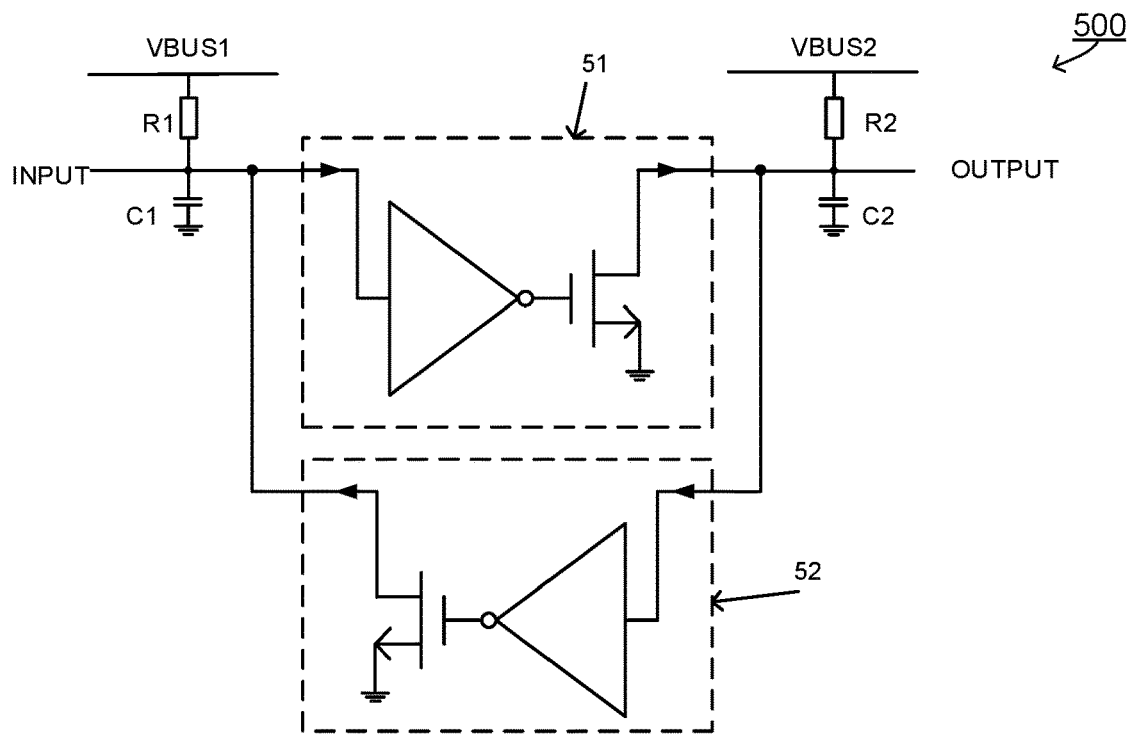
FIG. 5 illustrates a circuit diagram of a bi-directional buffer 500 according to an embodiment of the present invention.

FIG. 5 illustrates a circuit diagram of a bi-directional buffer 500 according to an embodiment of the present invention. The bi-directional buffer 500 may have an input terminal to receive the input voltage signal INPUT, an output terminal to provide an output voltage OUTPUT, a first transmission circuit 51 and a second transmission circuit 52. The input terminal of the bi-directional buffer 500 is coupled to a first power supply VBUS1 through a first resistor R1, and the output terminal of the bi-directional buffer 500 is coupled to a second power supply VBUS2 through a second resistor R2. In an embodiment, the first power supply VBUS1 and the second power supply VBUS2 may have a different voltage value. In another embodiment, the first power supply VBUS1 and the second power supply VBUS2 may have the same voltage value. In FIG. 5, the input terminal of the bi-directional buffer 500 is further coupled to a reference ground via a first capacitor C1, and the output terminal of the bi-directional buffer 500 is also coupled to the reference ground via a second capacitor C2. It should be noted that the input terminal and output terminal of the bi-directional buffer 500 are only labeled here for a purpose of clear description. In practical applications, for the bi-directional buffer 500 is bi-directional, the input terminal may transmit its received signal to the output terminal through the first transmission circuit 51, and the output terminal may also transmit its received signal to the input terminal through the second transmission circuit 52.

Figure 6:
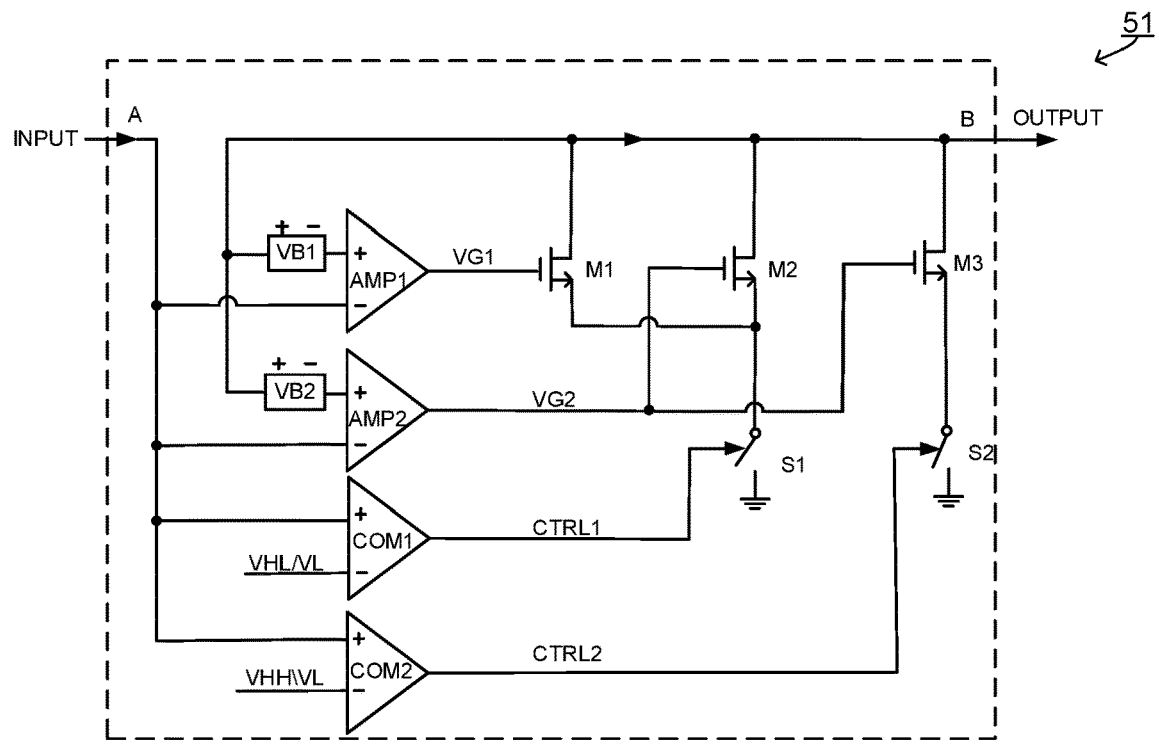
FIG. 6 illustrates a schematic diagram of the first transmission circuit 51 in the bi-directional buffer 500 shown in FIG. 5 according to an embodiment of the present invention.

FIG. 6 illustrates a schematic diagram of the first transmission circuit 51 in the bi-directional buffer 500 shown in FIG. 5 according to an embodiment of the present invention. The first transmission circuit 51 may have a first driving switch M1, a second driving switch M2, a first switch S1, a first comparator COM1, a first operational amplifier AMP1 and a second operational amplifier AMP2. The first driving switch M1 may have a first terminal and a second terminal, wherein the first terminal of the first driving switch M1 may be coupled to the output terminal B of the first transmission circuit 51. The second driving switch M2 may have a first terminal and a second terminal, wherein the second terminal of the second driving switch M2 is coupled to the output terminal B of the first transmission circuit 51. The first switch 51 may have a first terminal and a second terminal, wherein the first terminal of the first switch 51 is coupled to the second terminal of the first driving switch M1 and the second terminal of the second driving switch M2, wherein the second terminal of the first switch S1 is coupled to a reference ground. The first comparator COM1 is configured to compare the input voltage signal INPUT with a first voltage threshold VHL and a second voltage threshold VL respectively, and to generate a first comparison signal CTRL1 to control the first switch S1. Wherein when the input voltage signal INPUT is increased to the first voltage threshold VHL, the first switch S1 is controlled to be turned off by the first comparison signal CTRL1, and when the input voltage signal INPUT is decreased to the second voltage threshold VL, the first switch S1 is controlled to be turned on by the first comparison signal CTRL1. In an embodiment, the first voltage threshold VHL is between 0.4V to 0.6V and the second voltage threshold VL is between 0.8V to 1V. The first operational amplifier AMP1 may have a first input terminal coupled to the input terminal A of the first transmission circuit 51 to receive the input voltage signal INPUT and a second input terminal to receive the output voltage signal OUTPUT. The first operational amplifier AMP1 is configured to generate a first gate signal VG1 to control the first driving switch M1 to regulate a voltage difference between the output voltage signal OUTPUT and the input voltage signal INPUT at a first bias voltage VB1. In FIG. 6, the first driving switch M1 may further have a driving terminal to receive the first gate signal VG1. The second operational amplifier AMP2 may have a first input terminal to receive the input voltage signal INPUT and a second input terminal to receive the output voltage signal OUTPUT, and to generate a second gate signal VG2 to control the second driving switch M2 to regulate the voltage difference between the output voltage signal OUTPUT and the input voltage signal INPUT at a second bias voltage VB2, wherein the second bias voltage VB2 is smaller than the first bias voltage VB1. In FIG. 6, the second driving switch M2 may further have a driving terminal to receive the second gate signal VG2. In an embodiment, when the voltage difference between the output voltage signal OUTPUT and the input voltage signal INPUT is decreased to the first bias voltage VB1, the first operational amplifier AMP1 is disabled. In an embodiment, the first operational amplifier AMP1 is disabled means the first operational amplifier AMP1 is turned off. In another embodiment, the first operational amplifier is disabled means the first gate signal VG1 generated by the first operational amplifier AMP1 is blocked from the first driving switch M1.

Still referring to FIG. 6, when the first operational amplifier AMP1 is disabled suddenly, the output voltage signal OUTPUT is easy to have an oscillation, so the second gate signal VG2 is designed to be clamped at a fixed value for a preset duration to avoid the oscillation. The second driving switch M2 is controlled by the second operational amplifier AMP2 to regulate the voltage difference between the output voltage signal OUTPUT and the input voltage signal INPUT at the second bias voltage VB2, wherein the second bias voltage VB2 is smaller than the first bias voltage VB1. In an embodiment, the preset duration is between 100 ns to 500 ns. In another embodiment, the preset duration may be designed depending on the practical application. In an embodiment, the first bias voltage VB1 is between 150 mV to 250 mV, and the second bias voltage VB2 is between 50 mV to 150 mV.

Continuing with the description of FIG. 6, the first transmission circuit 51 may further have a third driving switch M3, a second switch S2 and a second comparator COM2. The third driving switch M3 may have a first terminal coupled to the output terminal B of the first transmission circuit 51, and a second terminal. The second switch S2 may have a first terminal coupled to the second terminal of the third driving switch M3, and a second terminal coupled to a reference ground. The second comparator COM2 is configured to provide a second comparison signal CTRL2 to control the second switch S2 by comparing the input voltage signal INPUT with a third voltage threshold VHH and the second voltage threshold VL, wherein when the input voltage signal INPUT is increased to the third voltage threshold VHH, the second switch S2 is controlled to be turned on, and when the input voltage signal INPUT is decreased to the second voltage threshold VL, the second switch S2 is controlled to be turned off, wherein the third voltage threshold VHH is greater than the first voltage threshold VHL. In an embodiment, the third voltage threshold VHH is between 1.2 V to 1.4 V. In FIG. 6, the third driving switch M3 may further have a driving terminal configured to receive the second gate signal VG2 provided by the second operational amplifier AMP2. Since the second transmission circuit 52 may have a same circuit structure as the first transmission circuit 51, the description of the second transmission circuit 52 is not be repeated here for the purpose of brevity.

In the embodiment shown in FIG. 6, the first operational amplifier AMP1 may have a bandwidth greater than the bandwidth of the second operational amplifier AMP2. Since product of the gain and bandwidth of each operational amplifier is constant, if an operational amplifier has a higher bandwidth, it can deal a signal of a higher frequency, i.e., the operational amplifier may have a faster transient response.

Figure 7:
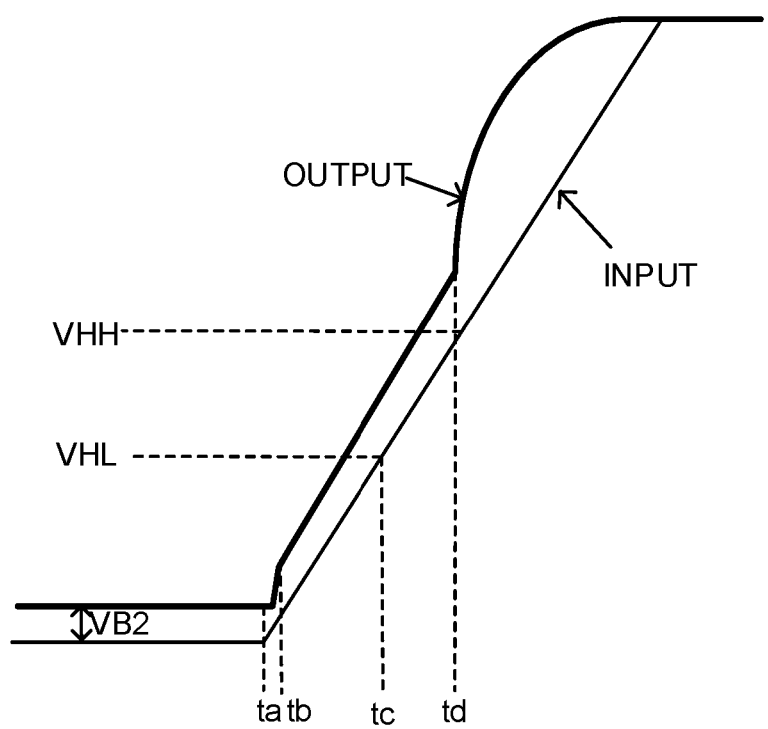
FIG. 7 illustrates a waveform diagram of the output voltage signal OUTPUT of the first transmission circuit 51 shown in FIG. 6 when the input voltage signal INPUT received at the input terminal A transits from the logic low state to the logic high state according to an embodiment of the present invention.

FIG. 7 illustrates a waveform diagram of the output voltage signal OUTPUT of the first transmission circuit 51 shown in FIG. 6 when the input voltage signal INPUT received at the input terminal A transits from the logic low state to the logic high state according to an embodiment of the present invention. Before moment ta, the input voltage signal INPUT and the output voltage signal OUTPUT are both at the logic low state, and the input voltage signal INPUT and the output voltage signal OUTPUT have a voltage difference equaling to the second bias voltage VB2. At moment ta, the input voltage signal INPUT starts to rise, the output voltage signal OUTPUT has a rising slope, wherein the rising slope during a period from moment ta to moment tb is determined by the second resistor R2 and the second capacitor C2 coupled to the output terminal B. The output voltage signal OUTPUT is increased to have a voltage difference equaling to the second bias voltage VB2 with the output voltage signal OUTPUT at moment tb, so the second operational amplifier AMP2 starts to regulate, and the output voltage signal OUTPUT and the input voltage signal INPUT is regulated to have the voltage difference at the second bias voltage VB2. At moment tc, the input voltage signal INPUT rises to the first voltage threshold VHL, so the first switch S1 is turned off. During a period from moment tc to moment td, the first switch S1 is turned off, the pull-down function of the first driving switch M1 and the second driving switch M2 is disabled, so the output voltage signal OUTPUT will not be pulled down excessively by the input voltage signal INPUT as shown in FIG. 4. From moment tc to moment td, the voltage difference between the output voltage signal OUTPUT and the input voltage signal INPUT is regulated equaling to the second bias voltage VB2. At moment td, the input voltage signal INPUT is increased to the third voltage threshold VHH, so the second switch S2 is turned off, and the rising slope of the output voltage signal OUTPUT after moment td is also determined by the second resistor R2 and the second capacitor C2 coupled to the output terminal B.

Figure 8:
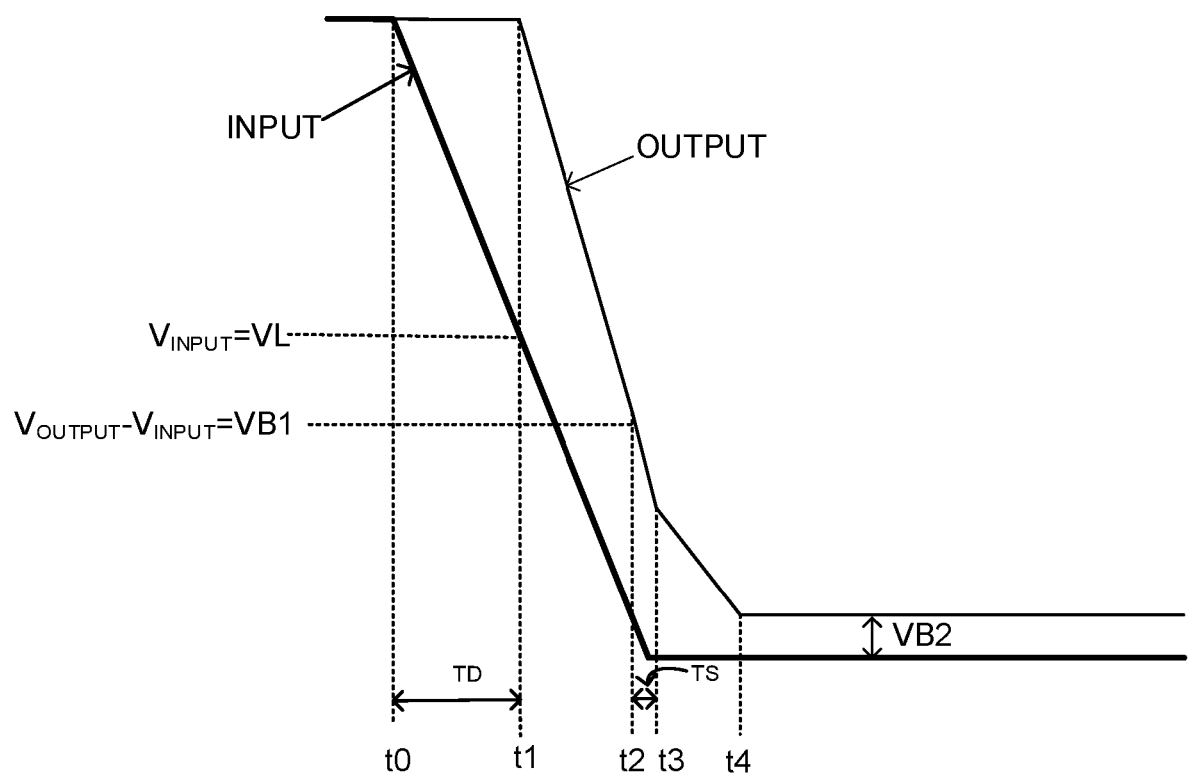
FIG. 8 illustrates a waveform diagram of the output voltage signal OUTPUT of the first transmission circuit 51 shown in FIG. 6 when the input voltage signal INPUT received at the input terminal A transits from the logic high state to the logic low state according to an embodiment of the present invention.

FIG. 8 illustrates a waveform diagram of the output voltage signal OUTPUT of the first transmission circuit 51 shown in FIG. 6 when the input voltage signal INPUT received at the input terminal A transits from the logic high state to the logic low state according to an embodiment of the present invention. The input voltage signal INPUT is decreased from moment t0, and at moment t1, the input voltage signal INPUT is decreased to the second voltage threshold VL, the first switch S1 is turned on by the first comparison signal CTRL1, and the second switch S2 is turned on by the second comparison signal CTRL2. Since the first operational amplifier AMP1 has a high bandwidth, the output voltage signal OUTPUT is pulled down quickly, and the delay duration TD between the output voltage signal OUTPUT and the input voltage signal INPUT is relative short. At moment t2, since the voltage difference between the output voltage signal OUPUT and the input voltage signal INPUT is equal to the first bias voltage VB1, so the first operational amplifier AMP1 is disabled, and the second gate signal VG2 is clamped at a fixed value for a preset duration TS (from moment t2 to moment t3), and then the output voltage signal OUTPUT is decreased slowly after moment t3. In FIG. 8, the output voltage signal OUTPUT has a decline slope, wherein the decline slope during a period from moment t3 and moment t4 (controlled by the first operational amplifier AMP1) is smaller than the decline slope during a period from moment t1 and moment t2 (controlled by the second operational amplifier AMP2), i.e. the output voltage signal OUTPUT decreases slower between moment t3 and moment t4 than between moment t1 and moment t2. At moment t4, the voltage difference between the output voltage signal OUTPUT and the input voltage signal INPUT is decreased to the second bias voltage VB2.

With a bi-directional buffer in the present invention, on the one hand, the output voltage signal OUTPUT at the logic low state and the input voltage signal INPUT at the logic low state are regulated to have a relative small voltage difference between them, i.e., the bi-directional buffer in the present invention may have a improved series capability, and on the other hand, the output voltage signal OUTPUT may quickly follow the input voltage signal INPUT, i.e., the bi-directional buffer may have an improved frequency characteristics.

The advantages of the various embodiments of the present invention are not confined to those described above. These and other advantages of the various embodiments of the present invention will become more apparent upon reading the whole detailed descriptions and studying the various Figs of the drawings.

From the foregoing, it will be appreciated that specific embodiments of the present invention have been described herein for purposes of illustration, but that various modifications may be made without deviating from the technology. Many of the elements of an embodiment may be combined with other embodiments in addition to or in lieu of the elements of the other embodiments. Accordingly, the present invention is not limited except as by the appended claims.

What is claimed is:

1. A bi-directional buffer comprising:
    an input terminal, configured to receive an input voltage signal;
    an output terminal, configured to output an output voltage signal, wherein the output voltage signal is configured to follow the input voltage signal;
    a first driving switch, having a first terminal and a second terminal, wherein the first terminal of the first driving switch is coupled to the output terminal;
    a second driving switch, having a first terminal and a second terminal, wherein the first terminal of the second driving switch is coupled to the output terminal;
    a first switch, having a first terminal and a second terminal, wherein the first terminal of the first switch is coupled to the second terminal of the first driving switch and the second terminal of the second driving switch, the second terminal of the first switch is coupled to a reference ground;
    a first comparator, configured to generate a first comparison signal to control the first switch by comparing the input voltage signal with a first voltage threshold and a second voltage threshold, wherein when the input voltage signal is increased to the first voltage threshold, the first switch is turned off, and when the input voltage signal is decreased to the second voltage threshold, the first switch is turned on;
    a first operational amplifier, configured to receive the input voltage signal and the output voltage signal, and to generate a first gate signal to the first driving switch to regulate a voltage difference between the output voltage signal and the input voltage signal at a first bias voltage; and
    a second operational amplifier, configured to receive the input voltage signal and the output voltage signal, and to generate a second gate signal to the second driving switch to regulate the voltage difference between the output voltage signal and the input voltage signal at a second bias voltage, wherein the second bias voltage is smaller than the first bias voltage.

2. The bi-directional buffer of claim 1, wherein when the input voltage signal and the output voltage signal are in a logic low state, the output voltage signal is greater than the input voltage signal.

3. The bi-directional buffer of claim 1, further comprising:
    a third driving switch, having a first terminal and a second terminal, wherein the first terminal is coupled to the output terminal;
    a second switch, having a first terminal and a second terminal, wherein the first terminal of the second switch is coupled to the second terminal of the third driving switch, and the second terminal of the second switch is coupled to the reference ground; and
    a second comparator, configured to generate a second comparison signal to control the second switch by comparing the input voltage signal with the second voltage threshold and a third voltage threshold, wherein when the input voltage signal is increased to the third voltage threshold, the second switch is turned off, and when the input voltage signal is decreased to the second voltage threshold, the second switch is turned on, wherein the third voltage threshold is greater than the second voltage threshold.

4. The bi-directional buffer of claim 3, wherein the first voltage threshold is between 0.4V to 0.6V, the second voltage threshold is between 0.8V to 1V, and the third voltage threshold is between 1.2V to 1.4V.

5. The bi-directional buffer of claim 1, wherein the first operational amplifier has a bandwidth greater than a bandwidth of the second operational amplifier.

6. The bi-directional buffer of claim 1, wherein the first bias voltage is between 150 mV to 250 mV, and the second bias voltage is between 50 mV to 150 mV.

7. The bi-directional buffer of claim 1, wherein the input terminal is coupled to a first power supply by a first resistor, and the output terminal is coupled to a second power supply by a second resistor.

8. The bi-directional buffer of claim 7, wherein the first power supply and the second power supply have a same voltage value.

9. The bi-directional buffer of claim 1, wherein the input terminal is coupled to the reference ground by a first capacitor, the output terminal is coupled to the reference ground by a second capacitor.

10. The bi-directional buffer of claim 1, wherein when the voltage difference between the output voltage signal and the input voltage signal is decreased to the first bias voltage, the second gate signal is clamped at a fixed value for a preset duration.

11. The bi-directional buffer of claim 10, wherein the preset duration is between 100 ns to 500 ns.

\* \* \* \* \*